(12) United States Patent
Kikuchi et al.

(10) Patent No.: US 11,056,341 B2
(45) Date of Patent: Jul. 6, 2021

(54) OPTICAL SEMICONDUCTOR ELEMENT AND METHOD OF MANUFACTURING THE SAME

(71) Applicant: SUMITOMO ELECTRIC INDUSTRIES, LTD., Osaka (JP)

(72) Inventors: Takehiko Kikuchi, Osaka (JP); Morihiro Seki, Osaka (JP); Nobuhiko Nishiyama, Tokyo (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 16 days.

(21) Appl. No.: 16/571,934

(22) Filed: Sep. 16, 2019

(65) Prior Publication Data

US 2020/0098567 A1 Mar. 26, 2020

(30) Foreign Application Priority Data

Sep. 26, 2018 (JP) .............................. JP2018-180453

(51) Int. Cl.
*H01L 21/02* (2006.01)
*H01S 5/343* (2006.01)
(Continued)

(52) U.S. Cl.
CPC ........ *H01L 21/205* (2013.01); *G02B 6/12004* (2013.01); *G02B 6/136* (2013.01);
(Continued)

(58) Field of Classification Search
CPC ........... H01L 31/02327; H01L 31/0232; H01L 31/18; H01L 33/58; H01L 21/02521;
(Continued)

(56) References Cited

U.S. PATENT DOCUMENTS 9,484,711 B2 * 11/2016 Padullaparthi ....... G02B 6/4206
9,755,097 B2 *  9/2017 Yoshida ................ H01L 31/105
(Continued)

FOREIGN PATENT DOCUMENTS

JP    2011-192878    9/2011
JP    2015-156440    8/2015

OTHER PUBLICATIONS

Fish, Gregory A., et al, Enabling Flexible Datacenter Interconnect Networks with WDM Silicon Photonics, *Proceedings of the IEEE 2014 Custom Integrated Circuits Conference*, Sep. 15-17, 2014.
(Continued)

*Primary Examiner* — Michael M Trinh
(74) *Attorney, Agent, or Firm* — Smith, Gambrell & Russell, LLP.

(57) ABSTRACT

A method of manufacturing an optical semiconductor element includes: stacking a plurality of compound semiconductor layers on a first substrate containing a compound semiconductor; dividing the first substrate into small pieces; forming terraces, grooves, walls, and a first mesa for a waveguide on a second substrate containing silicon; jointing at least one small piece to the second substrate after the forming; wet-etching the first substrate so as to expose the compound semiconductor layers after the jointing; and forming a second mesa opposite to the first mesa from the compound semiconductor layers; wherein the grooves are formed on both sides of the first mesa, the terraces are formed on both sides of the first mesa and the grooves, and the walls are arranged in an extending direction of each groove.

9 Claims, 12 Drawing Sheets

(51) Int. Cl.
  *G02B 6/136* (2006.01)
  *H01L 31/0232* (2014.01)
  *H01L 21/205* (2006.01)
  *H01S 5/227* (2006.01)
  *H01S 5/223* (2006.01)
  *H01S 5/12* (2021.01)
  *H01S 5/323* (2006.01)
  *H01S 5/042* (2006.01)
  *H01L 33/58* (2010.01)
  *G02B 6/12* (2006.01)

(52) U.S. Cl.
  CPC .... *H01L 21/0262* (2013.01); *H01L 21/02521* (2013.01); *H01L 31/02327* (2013.01); *H01L 33/58* (2013.01); *H01S 5/0425* (2013.01); *H01S 5/12* (2013.01); *H01S 5/2238* (2013.01); *H01S 5/2275* (2013.01); *H01S 5/32391* (2013.01); *H01S 5/343* (2013.01)

(58) Field of Classification Search
  CPC ... H01L 21/0262; H01L 21/205; G02B 6/136; G02B 6/12004; G02B 6/1228; G02B 2006/12061; H01S 5/1032; H01S 5/021; H01S 5/026; H01S 5/1014; H01S 5/141; H01S 5/343
  See application file for complete search history.

(56) References Cited

U.S. PATENT DOCUMENTS

| | | | |
|---|---|---|---|
| 2015/0078703 A1* | 3/2015 | Park | H01L 33/58 385/14 |
| 2017/0331248 A1* | 11/2017 | Lambert | G02B 6/12004 |
| 2019/0072715 A1* | 3/2019 | Parker | H01L 21/30617 |

OTHER PUBLICATIONS

Luo, Xianshu, et al., High-throughput multiple dies-to-wafer bonding technology and III/V—on—Si hybrid lasers for heterogeneous integration of optoelectronic integrated circuits, *Frontiers in Materials*, Original Research Article, vol. 2, Article 28, pp. 1-21, Apr. 7, 2015.

* cited by examiner

OPTICAL SEMICONDUCTOR ELEMENT AND METHOD OF MANUFACTURING THE SAME

CROSS-REFERENCE TO RELATED APPLICATION

This application is based upon and claims the benefit of priority of the prior Japanese Patent Application No. 2018-180453, filed on Sep. 26, 2018, the entire contents of which are incorporated herein by reference.

BACKGROUND

(i) Technical Field

The present invention relates to an optical semiconductor element and a method of manufacturing the same.

(ii) Related Art

Recently, a technology called silicon photonics to produce an optical integrated circuit on a silicon wafer has been actively researched. One method of forming an active element such as a light emitting element on a silicon wafer is a hybrid integration technology using wafer junction (see Japanese Patent Application Laid-Open Nos. 2015-156440 and 2011-192878, for example). In this technology, a compound semiconductor wafer in which stack structure for the active element is formed is jointed, by a wafer junction method, to the silicon wafer on which a waveguide is formed. After the wafer junction, a compound semiconductor substrate is removed by wet etching or the like so as to leave the stack structure, and the active element is produced using a compound semiconductor processing technology such as lithography or etching.

SUMMARY

In the hybrid integration technology using the wafer junction, it is required that the silicon wafer and the compound semiconductor wafer have the same diameter as each other. However, a process producing a large diameter of 10 inches or more can be applied to the silicon wafer at present whereas it is difficult to produce a large diameter of the compound semiconductor wafer. Therefore, a wafer diameter is limited by the compound semiconductor wafer. Since a region for forming the active element on the silicon wafer is small, many portions of the compound semiconductor substrate are etched when the silicon wafer and the compound semiconductor wafer are jointed. For this reason, the loss of the compound semiconductor is made large. Therefore, the compound semiconductor wafer is divided into small pieces, and some small pieces may be jointed only to a peripheral portion of the region for forming the active element on the silicon wafer. This makes it possible to reduce the loss of the compound semiconductor wafer.

In the hybrid integration technology, after the wafer junction, the compound semiconductor substrate is removed by wet etching so as to leave the stack structure. However, if the small pieces of the compound semiconductor are jointed to the silicon wafer, a silicon waveguide is exposed upon removing the compound semiconductor substrate by wet etching. When there are trenches on both sides of the silicon waveguide, an etchant enters into a junction interface from the trenches, and a compound semiconductor layer may also be etched together with the compound semiconductor substrate. When the compound semiconductor layer in the vicinity of the junction interface is etched, a junction strength is lowered and a small piece of the active element may be peeled off from the silicon wafer. Therefore, the present invention aims to provide an optical semiconductor element and a method of manufacturing the same that can suppress peeling of the small piece.

According to an aspect of the present invention, there is provided a method of manufacturing an optical semiconductor element including: stacking a plurality of compound semiconductor layers on a first substrate containing a compound semiconductor; dividing the first substrate into small pieces; forming terraces, grooves, walls, and a first mesa for a waveguide on a second substrate containing silicon; jointing at least one small piece to the second substrate after the forming; wet-etching the first substrate so as to expose the compound semiconductor layers after the jointing; and forming a second mesa opposite to the first mesa from the compound semiconductor layers; wherein the grooves are formed on both sides of the first mesa, the terraces are formed on both sides of the first mesa and the grooves, and the walls are arranged in an extending direction of each groove.

According to another aspect of the present invention, there is provided an optical semiconductor element including: a substrate containing silicon; and a small piece that is jointed to the substrate, and includes a compound semiconductor layer; wherein the substrate includes terraces, grooves, walls, and a first mesa for a waveguide, the grooves are formed on both sides of the first mesa, the terraces are formed on both sides of the first mesa and the grooves, the walls are arranged in an extending direction of each groove, the walls intersect the extending direction of the groove, and the small piece includes a second mesa opposite to the first mesa.

DETAILED DESCRIPTION

Figure 1A:
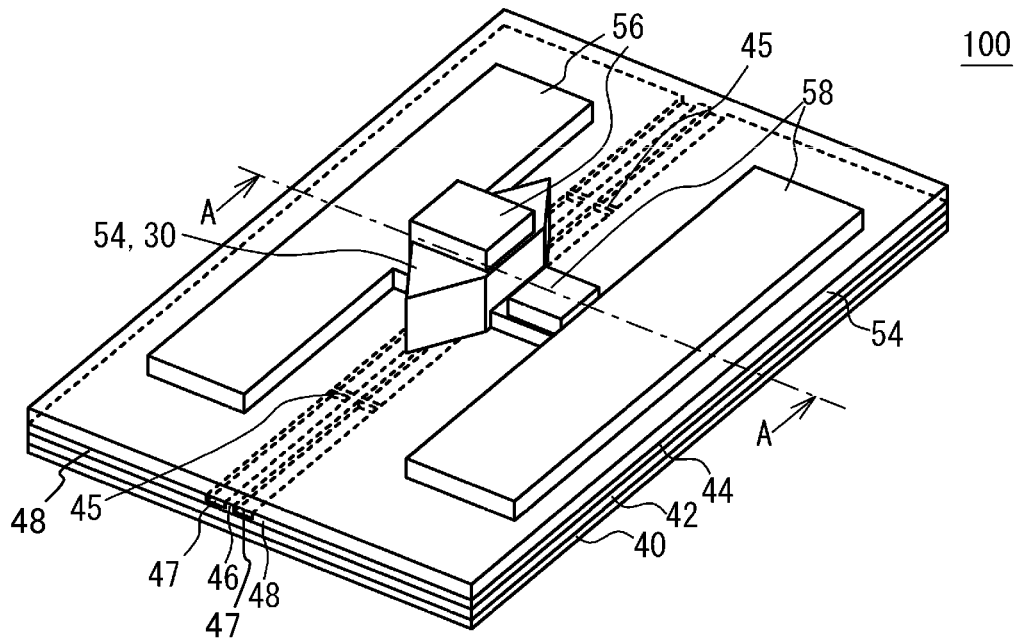
FIG. 1A is a perspective view showing an example of an optical semiconductor element according to a first embodiment.

Description of Embodiments of the Present Invention

First, the contents of embodiments of the present invention are listed below.

An embodiment of the present invention is (1) a method of manufacturing an optical semiconductor element including: stacking a plurality of compound semiconductor layers on a first substrate containing a compound semiconductor; dividing the first substrate into small pieces; forming terraces, grooves, walls, and a first mesa for a waveguide on a second substrate containing silicon; jointing at least one small piece to the second substrate after the forming; wet-etching the first substrate so as to expose the compound semiconductor layers after the jointing; and forming a second mesa opposite to the first mesa from the compound semiconductor layers; wherein the grooves are formed on both sides of the first mesa, the terraces are formed on both sides of the first mesa and the grooves, and the walls are arranged in an extending direction of each groove. The walls suppress the entering of an etchant from each groove. For this reason, the etching of the compound semiconductor layers is suppressed, and the peeling of the small piece is suppressed.

Preferably, the grooves and the first mesa may extend in a first direction, the grooves may be formed on both sides of the first mesa along a second direction intersecting the first direction, the terraces may be formed on both sides of the first mesa and the grooves along the second direction, and each of the grooves may include the walls away from each other in the first direction. These features are also applicable to the following (10) optical semiconductor element.

(2) The small piece may be jointed to the second substrate so as to overlap with the first mesa, the terraces, the grooves and the walls, and the second mesa may be located between the walls in the extending direction of the groove without overlapping with the walls. Since each groove is closed by the small piece, the first mesa, the terraces and the walls, the entering of the etchant is effectively suppressed. Therefore, the peeling of the small piece is effectively suppressed. Since the second mesa is located between the walls, it is less likely to be damaged by the etchant. Accordingly, the characteristic of the optical semiconductor element is stable.

(3) The first mesa and the walls may have the same height. Each groove is closed by the small piece, the first mesa, the terraces and the walls. Therefore, the entering of the etchant is effectively suppressed, and the peeling of the small piece is suppressed.

(4) Each of the walls may orthogonally intersects the first mesa. The walls suppress the entering of the etchant from the groove, and the peeling of the small piece is suppressed.

(5) An angle between each of the walls and the extending direction of the groove may be 30 degrees or more and 60 degrees or less. The walls suppress the entering of the etchant from the groove, and the peeling of the small piece is suppressed. Since the reflection of the light is also suppressed by the walls, it is suppressed that the reflected light resonates to make the operation of the active element unstable.

(6) Each of the walls may be connected to the first mesa and one of the terraces. Since each groove is closed by the walls, the entering of the etchant is effectively suppressed, and the peeling of the small piece is suppressed.

(7) Each of the walls may be connected to one of the first mesa and the terraces without being connected to the other thereof, the walls may be formed along the extending direction of the groove, and the walls may be located on each of both sides of the second mesa in the extending direction of the groove. Due to a surface tension of the etchant, it takes time for the etchant to pass through the walls, and further it takes longer time by the plurality of walls. Therefore, the etching of the compound semiconductor substrate is completed before the compound semiconductor layer of the small piece is etched. Thereby, the peeling of the small piece is suppressed.

(8) Each of the walls may be connected to the first mesa without being connected to the terraces. Each of the walls functions as a diffraction grating.

(9) The thickness of each of the walls in the extending direction of the groove may be 0.1 μm or more and 2 μm or less. Thereby, in the etching of the compound semiconductor substrate, the walls suppress the entering of the etchant from the groove, and the etching does not easily proceed to the compound semiconductor layer. Moreover, it is possible to suppress light loss caused when the light passes through the walls.

(10) An optical semiconductor element includes: a substrate containing silicon; and a small piece that is jointed to the substrate, and includes a compound semiconductor layer; wherein the substrate includes terraces, grooves, walls, and a first mesa for a waveguide, the grooves are formed on both sides of the first mesa, the terraces are formed on both sides of the first mesa and the grooves, the walls are arranged in an extending direction of each groove, the walls intersect the extending direction of the groove, and the small piece includes a second mesa opposite to the first mesa. The walls suppress the entering of the etchant from the groove. Therefore, the etching of the compound semiconductor layer is suppressed, and the peeling of the small piece is suppressed.

Detailed Description of an Embodiment of the Present Invention

The following is a description of specific examples of an optical semiconductor element and a method of manufacturing the optical semiconductor element according to an embodiment of the present invention, with reference to the drawings. It should be noted that the present invention is not limited to these examples but is indicated by the claims, and it is intended that all changes within the meanings and the scopes of the claims and the equivalents thereof are included therein.

First Embodiment (Optical Semiconductor Element 100)

Figure 1B:
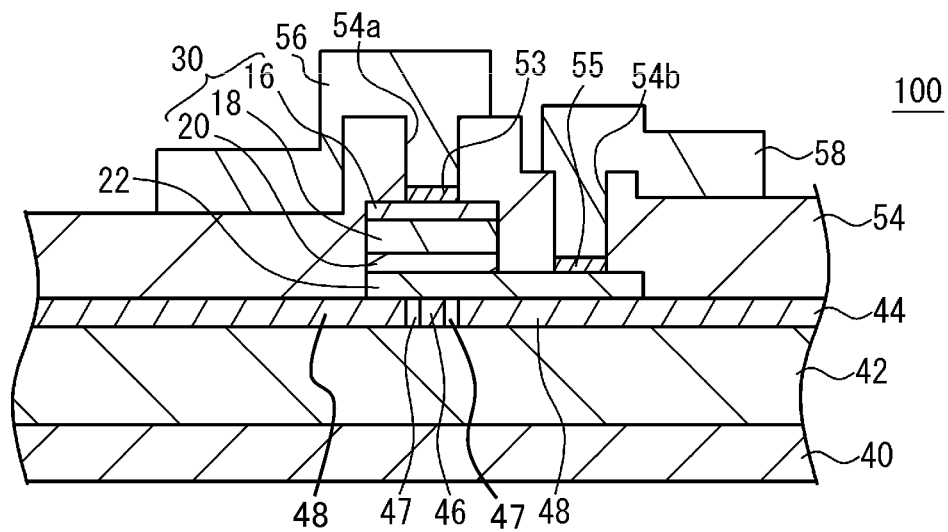
FIG. 1B is a cross-sectional view taken along a line A-A of FIG. 1A.

FIG. 1A is a perspective view showing an example of an optical semiconductor element 100 according to a first embodiment. FIG. 1B is a cross-sectional view taken along a line A-A of FIG. 1A. As shown in FIGS. 1A and 1B, the optical semiconductor element 100 includes a substrate 40, an SiO$_2$ layer 42, an Si layer 44, a mesa 30, an insulating film 54, a p-type wiring 56 and an n-type wiring 58.

The substrate 40 containing silicon (Si), the SiO$_2$ layer 42 and the Si layer 44 forma silicon-on-insulator (SOI) substrate. The Si layer 44 is provided with walls 45, a waveguide mesa 46, grooves 47 and terraces 48. The detailed configuration thereof is described later.

The mesa 30 has tapered shapes at both ends thereof, and is formed by a p-type contact layer 16, a p-type clad layer 18 and an active layer 20. The tips of the mesa 30, i.e., the tips of tapered shapes are located on the waveguide mesa 46. An n-type contact layer 22 is provided between the active layer 20 and the Si layer 44. As described later, the SOI wafer is jointed to a compound semiconductor containing the active layer 20, so that the optical semiconductor element 100 is formed.

The insulating film 54 covers the Si layer 44, the n-type contact layer 22 and the mesa 30. The insulating film 54 has an opening 54a on the mesa 30, and an opening 54b on the n-type contact layer 22. A p-type electrode 53 is provided on an upper surface of the p-type contact layer 16 inside the opening 54a. The p-type wiring 56 is provided so as to cover the opening 54a and an upper surface of the insulating film 54, and is in contact with the p-type electrode 53.

An n-type electrode 55 is provided on an upper surface of the n-type contact layer 22 inside the opening 54b. The n-type wiring 58 is provided so as to cover the opening 54b and the upper surface of the insulating film 54, and is in contact with the n-type electrode 55.

The optical semiconductor element 100 includes a small piece 32 which is an active element and the SOI substrate including a passive element. The small piece 32 and the SOI substrate are jointed to each other. The optical semiconductor element 100 functions as a hybrid laser which is evanescent-optically coupled. For example, a spontaneous emission light having a wavelength distribution centered on a wavelength of 1.55 μm is emitted from the active layer 20, is output from the tip of the mesa 30, and propagates through the waveguide mesa 46. A light reflecting mechanism with wavelength selectivity including, for example, a ring resonator and a distributed bragg reflector (DBR) is provided so as to sandwich the active layer 20, so that only a light with a wavelength of 1.55 μm resonates inside the active layer 20 and is emitted from the optical semiconductor element 100 as a laser light.

(Manufacturing Method)

Figure 2A:
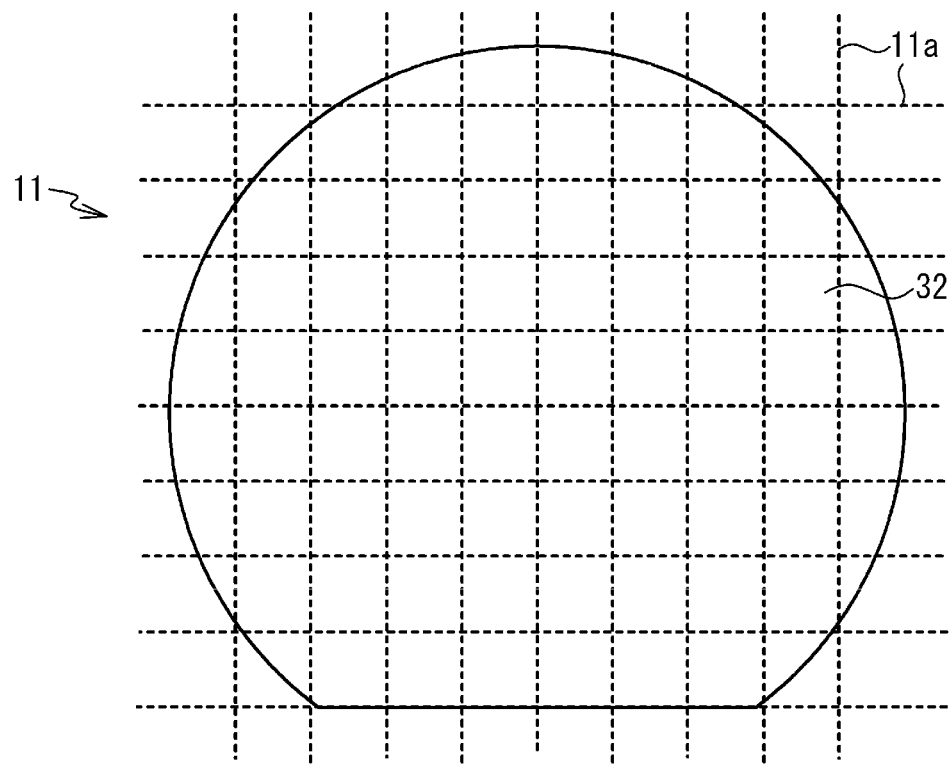
FIG. 2A is a plane view showing an example of a method of manufacturing the optical semiconductor element.
Figure 2B:
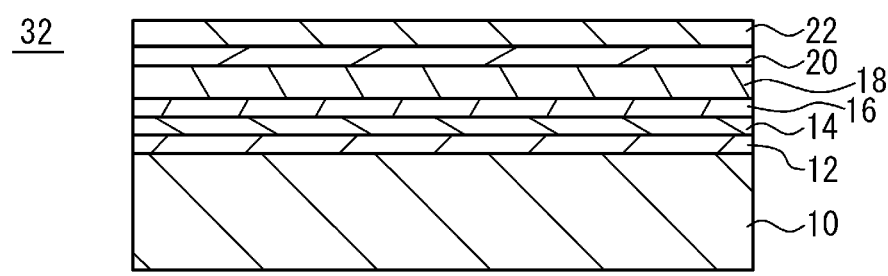
FIG. 2B is a cross-sectional view showing the example of the method of manufacturing the optical semiconductor element.
Figure 3A:
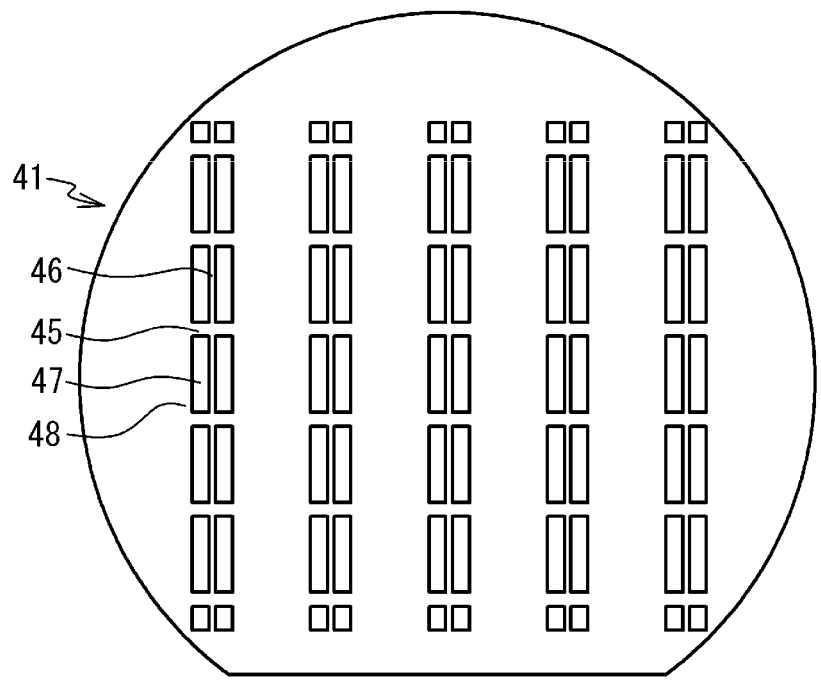
FIG. 3A is a plane view showing the example of the method of manufacturing the optical semiconductor element.
Figure 3B:
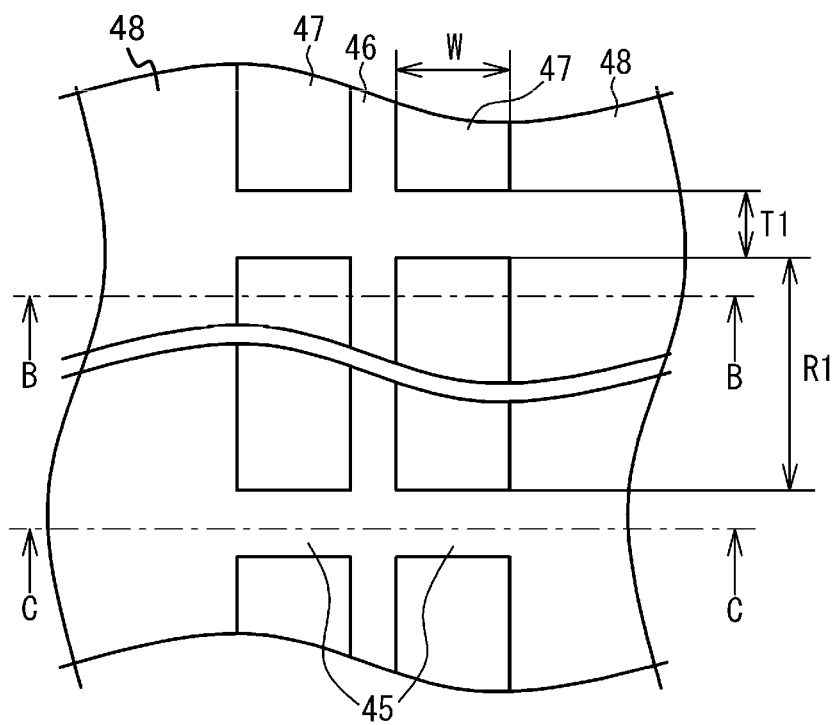
FIG. 3B is an enlarged plane view of a wall.

FIGS. 2A and 3A are plane views showing an example of a method of manufacturing the optical semiconductor element 100. FIG. 3B is an enlarged plane view of the walls 45. FIGS. 5A and 8A are perspective views showing the example of the method of manufacturing the optical semiconductor element 100. FIGS. 2B, 4B, 4C, 5B to 7B, and 8B to 9C are cross-sectional views showing the example of the method of manufacturing the optical semiconductor element 100.

(Compound Semiconductor)

FIGS. 2A and 2B show a step to be performed on a wafer 11 made of a compound semiconductor. The wafer 11 is made of a semiconductor substrate 10. For example, etching stop layers 12 and 14, the p-type contact layer 16, the p-type clad layer 18, the active layer 20, and the n-type contact layer 22 are epitaxially grown in order on the semiconductor substrate 10 by metal organic vapor phase epitaxy (MOVPE), molecular beam epitaxy (MBE) or the like.

The semiconductor substrate 10 is, for example, a compound semiconductor substrate made of p-type indium phosphorus (InP) having a thickness of 350 μm, and is the 2-inch wafer 11 as shown in FIG. 2A, for example. The above compound semiconductor layers are stacked on the entire surface of the wafer 11.

The etching stop layer 12 is made of, for example, undoped gallium indium arsenide (GaInAs), and the etching stop layer 14 is made of, for example, undoped indium phosphorus (InP). The p-type contact layer 16 is made of, for example, p-type GaInAs having a thickness of 100 nm. The p-type clad layer 18 is made of, for example, p-type InP with a thickness of 1800 nm. In the p-type layer, for example, zinc (Zn) or the like is doped. The active layer 20 is, for example, a multiple quantum well layer (MQW) having a thickness of 90 nm. In the active layer 20, a well layer and a barrier layer of GaInAsP are stacked by five layers, respectively. The n-type contact layer 22 is made of, for example, n-type InP having a thickness of 50 nm. In the n-type contact layer 22, for example, silicon (Si) or the like is doped.

After epitaxial growth, a plurality of small pieces 32 are formed from the wafer 11 by cutting the wafer 11 along scribe lines 11a shown by dotted lines in FIG. 2A. The length of one side of the small piece 32 is 5 mm, for example.

(SOI Substrate)

Figure 4A:
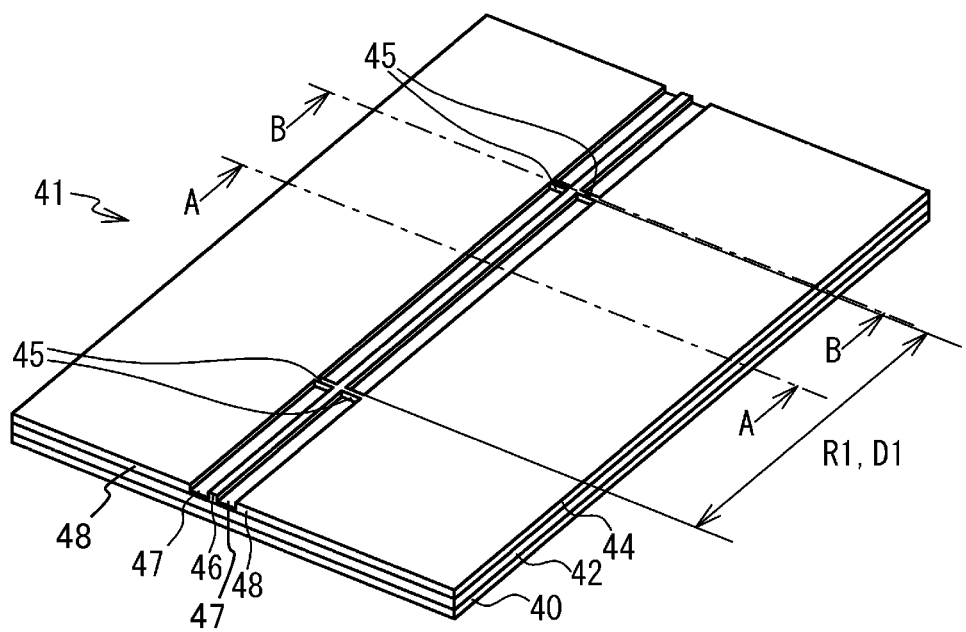
FIG. 4A is a perspective view showing the example of the method of manufacturing the optical semiconductor element.
Figure 4B:
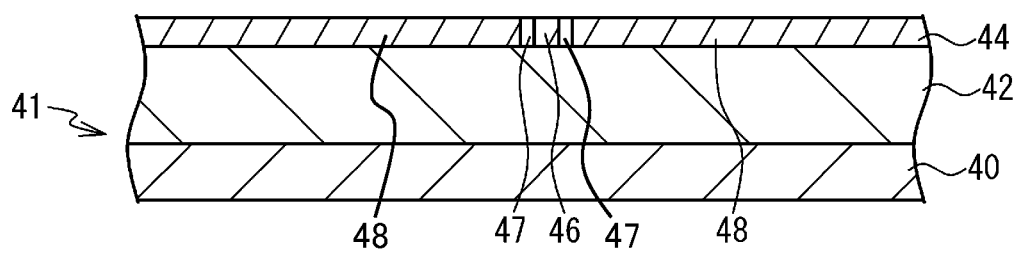
FIGS. 4B and 4C are cross-sectional views showing the example of the method of manufacturing the optical semiconductor element.
Figure 4C:
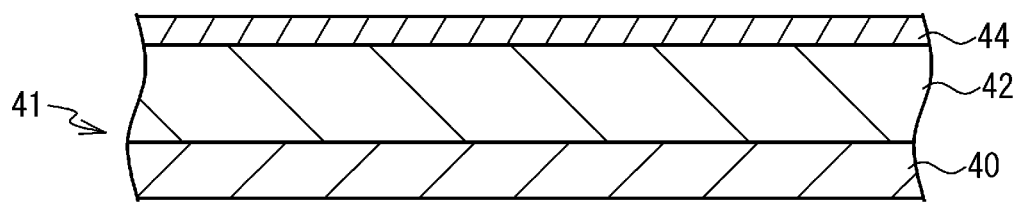
Figure 5A:
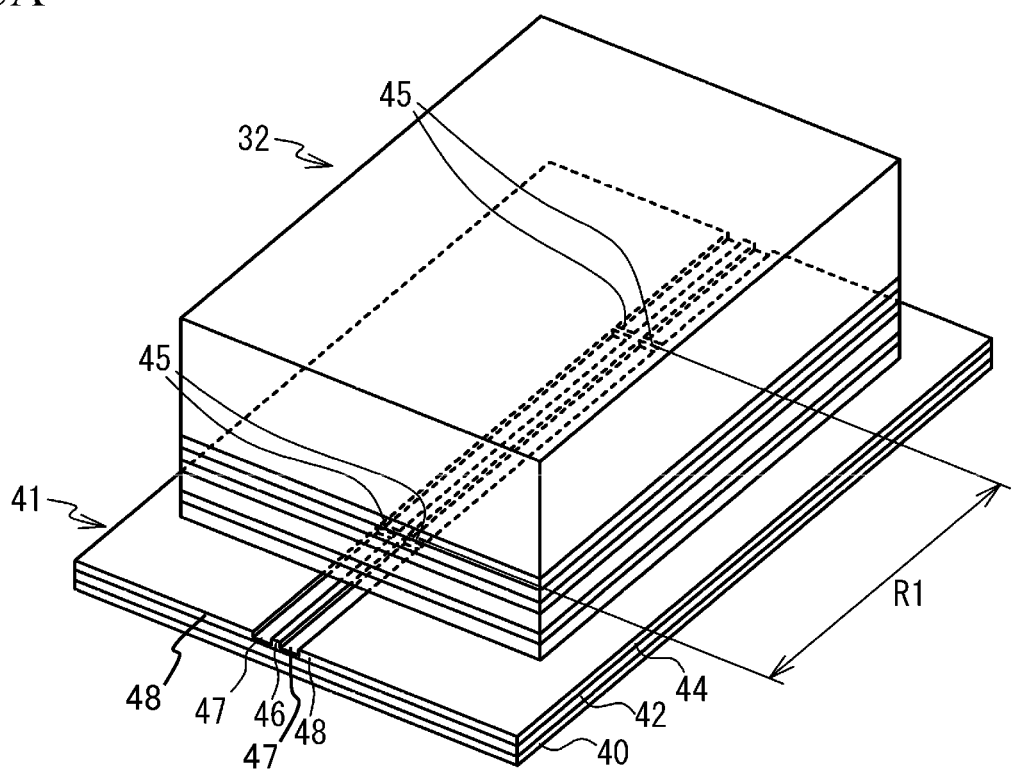
FIG. 5A is a perspective view showing the example of the method of manufacturing the optical semiconductor element.
Figure 5B:
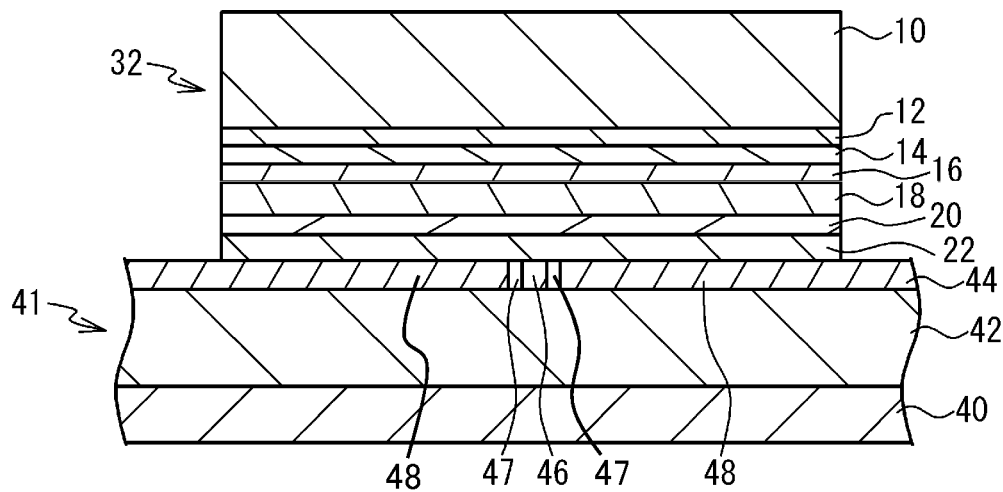
FIG. 5B is a cross-sectional view showing the example of the method of manufacturing the optical semiconductor element.

FIGS. 3A to 4C show steps to be performed on a wafer 41. FIG. 4B is a cross-sectional view taken along a line A-A of FIG. 3B, and FIG. 4C is a cross-sectional view taken along a line B-B of FIG. 3B. The wafer 41 is, for example, an 8-inch wafer, and is a silicon on insulator (SOI) substrate including the substrate 40 of Si, the SiO$_2$ layer 42 and the Si layer 44. For example, the thickness of the substrate 40 is 520 μm, the thickness of the SiO$_2$ layer 42 is 3 μm, and the thickness of the Si layer is 220 nm.

As shown in FIGS. 3A to 4B, a plurality of grooves 47 are formed in the Si layer 44 by dry etching, for example. Portions of the Si layer 44 which are not dry-etched become the waveguide mesa 46, a wall 45 and a terrace 48. The grooves 47 are formed on both side of the single waveguide mesa 46, and terraces 48 are formed on both side of the single waveguide mesa 46 and the two grooves 47. The waveguide mesa 46 and the grooves 47 extend in the same direction.

A plurality of walls 45 are provided in each of the grooves 47. As shown in FIG. 4A, a region between two walls 45 in an extending direction of each groove 47 is referred to as a region R1. The walls 45 intersect the grooves 47 and orthogonally intersect the waveguide mesa 46. Each wall 45 crosses the groove 47, and is connected to the waveguide mesa 46 and the terrace 48.

A width W of the groove 47 shown in FIG. 3B is, for example, 3 μm, and a thickness T1 of the wall 45 is, for example, 1 μm. A distance D1 between the walls 45 shown in FIG. 4A is, for example, 1 mm, and is smaller than the length of the small piece 32. As shown in FIG. 4B, the walls 45, the waveguide mesa 46 and the terraces 48 have the same height, and their upper surfaces lie in the same plane. The waveguide mesa 46 has a linear shape, but an optical circuit such as a tapered waveguide, a ring resonator, or a DBR reflector (diffraction grating) may be formed in the Si layer 44, for example.

(Junction and Subsequent Steps)

FIGS. 5A to 9C show Junction and subsequent steps. As shown in FIG. 5A, the small piece 32 is jointed to the wafer 41. In actual manufacturing steps, a plurality of small pieces 32 are jointed to the wafer 41. One of the small pieces 32 overlaps with the single waveguide mesa 46, two grooves 47, four walls 45 and a part of the terraces 48. Since the small piece 32 is longer than the region R1, the small piece 32 also overlaps with the region R1. The n-type contact layer 22 of the small piece 32 is in contact with the Si layer 44.

A surface activation junction method using $N_2$ plasma is used as a junction method of the small piece 32 and the wafer 41, for example. The small piece 32 is placed on a support substrate with the n-type contact layer 22 facing upward. For example, a silicon substrate is used as the support substrate. The support substrate may be provided with a recess for fixing the small piece 32. The small piece 32 placed on the support substrate is irradiated with $N_2$ plasma to activate the surface of the n-type contact layer 22 and generate a dangling bond of an atom. Similarly, the wafer 41 is also irradiated with $N_2$ plasma to activate the surfaces of the Si layer 44 and the waveguide mesa 46. Next, the wafer 41 is inverted, alignment is performed so that the region R1 overlaps with the small piece 32, and then the inverted wafer 41 is placed on the small piece 32 placed on the support substrate. Next, the temperature is raised to 150° C. while applying a load to the wafer 41 and the small piece 32, and annealing is performed for 2 hours. Thereby, the dangling bonds are bonded to each other, and the wafer 41 and the small piece 32 are jointed.

Figure 6A:
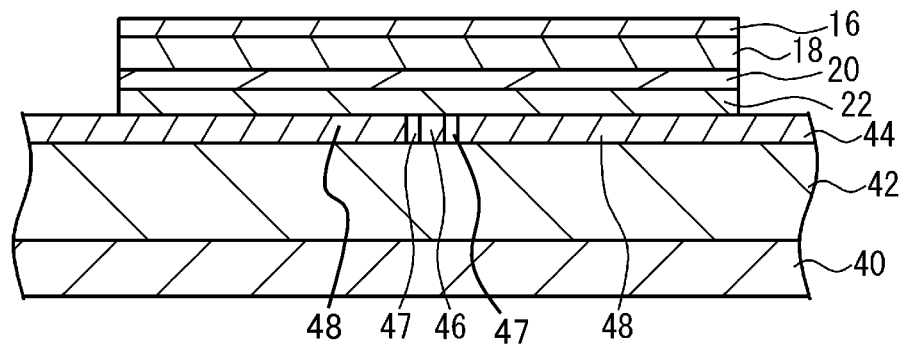
FIGS. 6A to 6C are cross-sectional views showing the example of the method of manufacturing the optical semiconductor element.

As shown in FIG. 6A, the semiconductor substrate 10 and the etching stop layers 12 and 14 are removed by wet etching, and the p-type contact layer 16 is exposed. The etchant is, for example, a liquid containing HCl, such as hydrochloric acid (HCl), a mixed solution of HCl and acetic acid or a mixed solution of HCl, hydrogen peroxide water and water.

In the wet etching, the wafer 41 is immersed in the etchant. Therefore, the etchant not only adheres to the surface of the semiconductor substrate 10 but also enters into the grooves 47 of the wafer 41. As shown in FIGS. 3A to 4C, the walls 45 are provided in each groove 47. The walls 45 suppress the entering of the etchant, so that damage to the n-type contact layer 22 of the small piece 32 is suppressed. Specifically, as shown in FIG. 5A, a portion of the groove 47 in the region R1 is sandwiched between the two walls 45 and closed by the two walls 45, the terraces 48 and the small piece 32. Therefore, the entering of the etchant is blocked, and a portion of the small piece 32 overlapping the region R1 (i.e., a region where the active element is formed) is hard to be etched. For this reason, partial peeling in which a part of the small piece 32 is slightly separated from the waveguide mesa 46, or peeling in which the small piece 32 completely falls off from the Si layer 44 is suppressed.

Figure 6B:
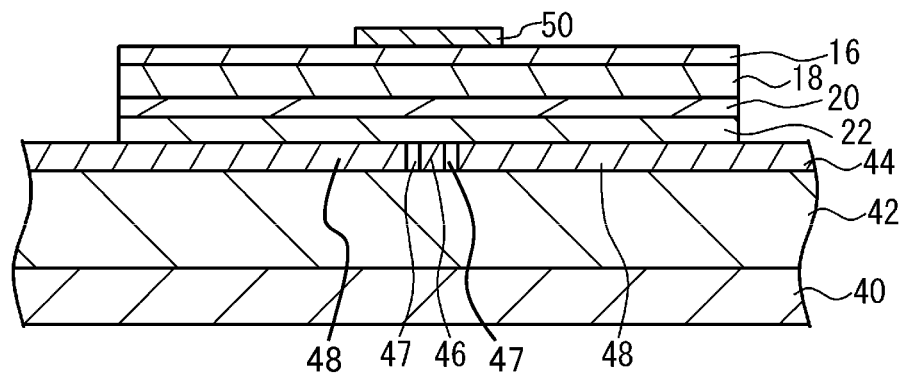

As shown in FIG. 6B, a mask 50 is formed on an upper surface of the p-type contact layer 16. The mask 50 is made of $SiO_2$ having a thickness of 500 nm for example, is formed by plasma CVD, and is shaped by resist patterning and etching using buffered hydrofluoric acid (BHF). The mask 50 is used to form the mesa 30 shown in FIGS. 1A and 1B, and has the same shape as the mesa 30.

Figure 6C:
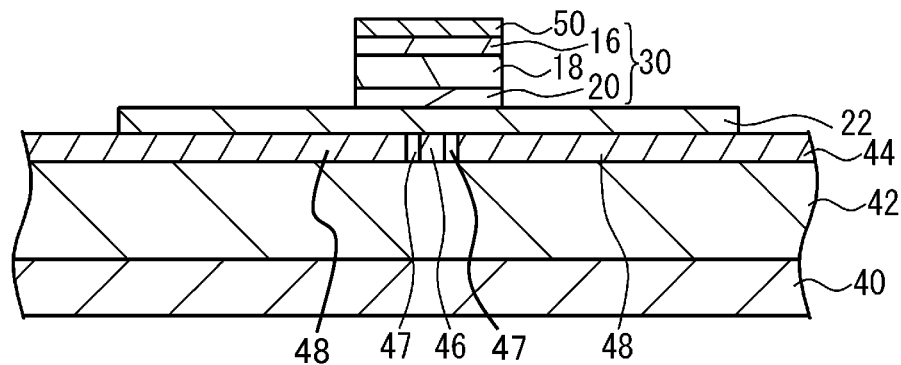

As shown in FIG. 6C, portions of the p-type contact layer 16, the p-type clad layer 18, and the active layer 20 which are not covered by the mask 50 are removed by wet etching, for example. Thereby, the mesa 30 is formed. As shown in FIG. 1A, the mesa 30 has the tapered shapes.

Figure 7A:
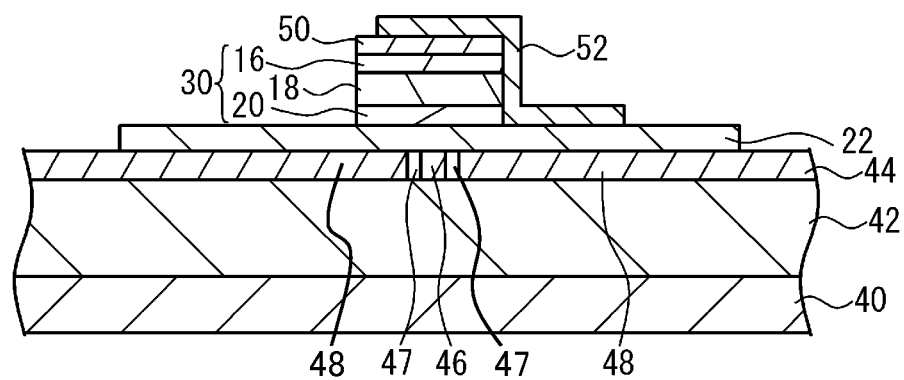
FIGS. 7A and 7B are cross-sectional views showing the example of the method of manufacturing the optical semiconductor element.
Figure 7B:
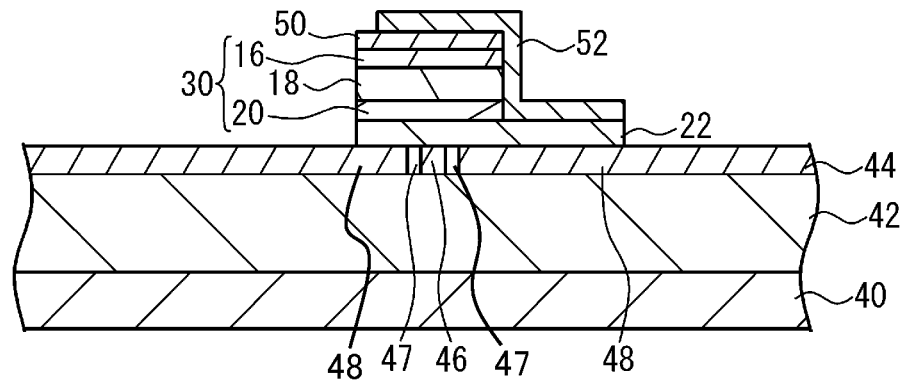
Figure 8A:
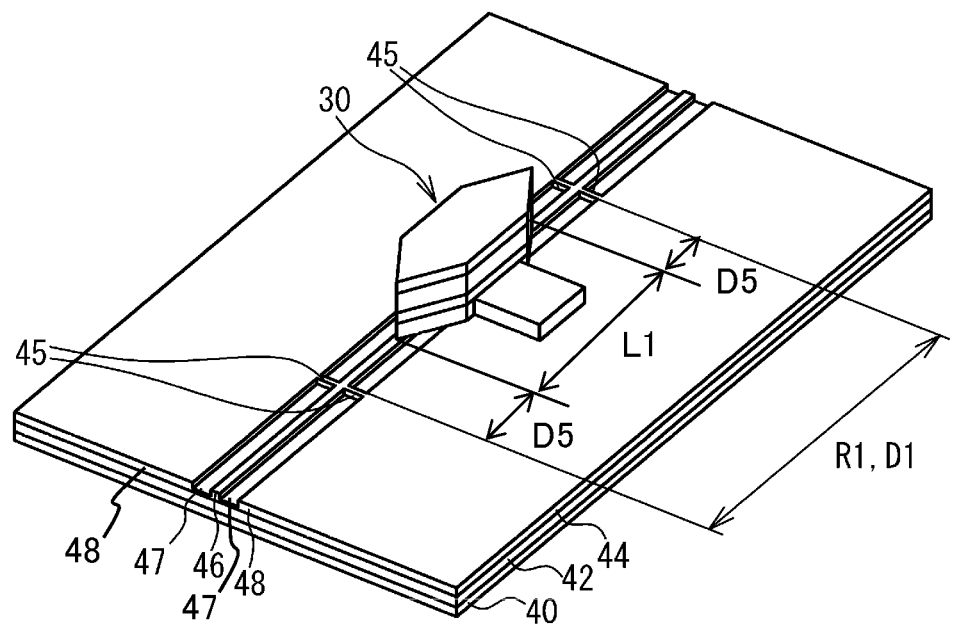
FIG. 8A is a perspective view showing the example of the method of manufacturing the optical semiconductor element.

As shown in FIG. 7A, a mask 52 is formed from an upper surface of the mask 50 to a side surface of the mesa 30 and an upper surface of the n-type contact layer 22. A portion of the n-type contact layer 22 is exposed from the mask 52. The mask 52 is made of $SiO_2$ having a thickness of 100 nm for example, is formed by plasma CVD, and is shaped by resist patterning and etching using buffered hydrofluoric acid (BHF). As shown in FIG. 7B, a portion of the n-type contact layer 22 exposed from the mask 52 is removed by dry etching, for example.

Figure 8B:
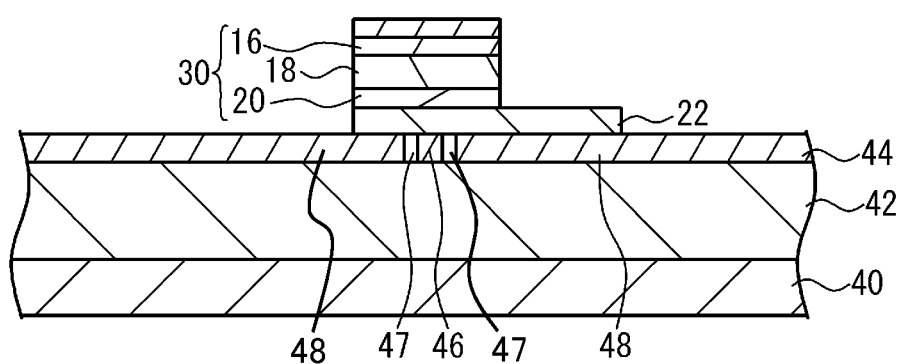
FIG. 8B is a cross-sectional view showing the example of the method of manufacturing the optical semiconductor element.

As shown in FIGS. 8A and 8B, the mask 52 is removed by etching using the BHF, for example. The mesa 30 and the n-type contact layer 22 remain on the Si layer 44. The length L1 of the mesa 30 is smaller than, for example, the distance D1 between the walls 45, and the mesa 30 is sandwiched between the walls 45 in the extending direction of the groove 47. The tips of the mesa 30 are located on the waveguide mesa 46. A distance D5 between the wall 45 and the mesa 30 is several tens μm to several hundreds μm, for example.

Figure 9A:
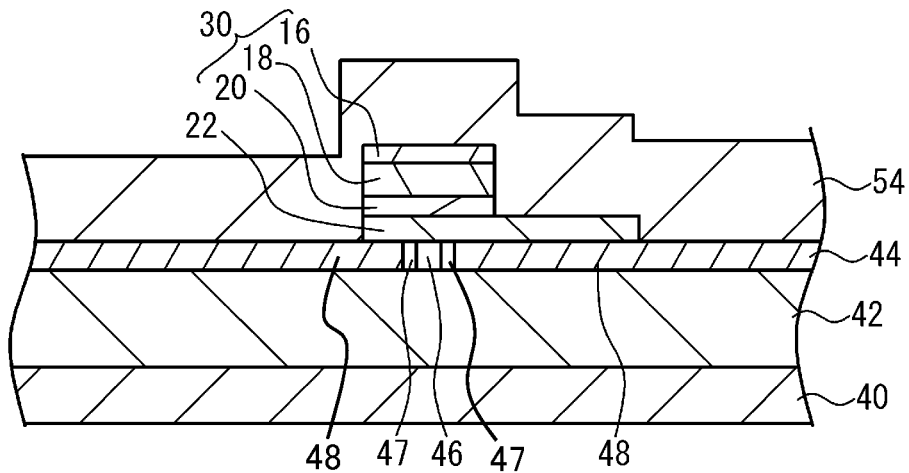
FIGS. 9A to 9C are cross-sectional views showing the example of the method of manufacturing the optical semiconductor element.

As shown in FIG. 9A, the insulating film 54 is formed by plasma CVD, for example. The insulating film 54 covers the mesa 30, the n-type contact layer 22 and the Si layer 44. The insulating film 54 is made of, for example, $SiO_2$ having a thickness of 1 μm, and functions as a clad layer.

Figure 9B:
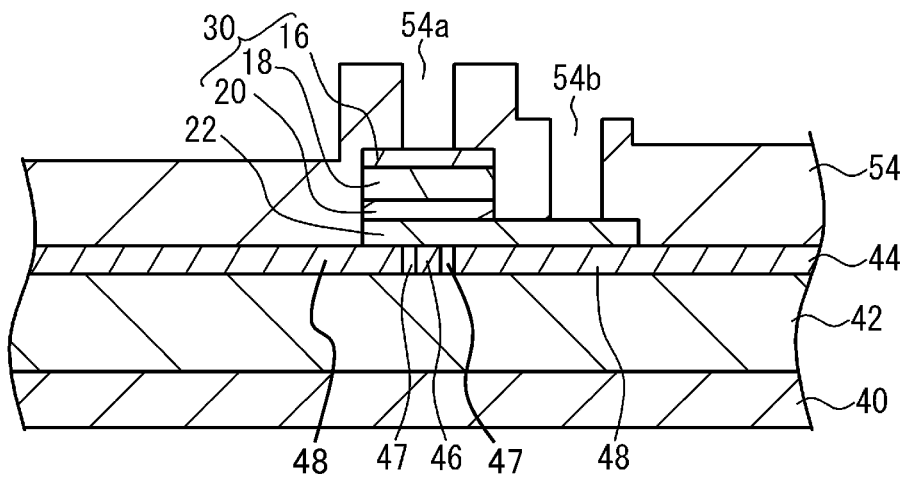

As shown in FIG. 9B, openings 54a and 54b are formed on the insulating film 54 by resist patterning and dry etching. The opening 54a is located on the mesa 30, and the p-type contact layer 16 is exposed from the opening 54a. The opening 54b is located on the n-type contact layer 22, and the n-type contact layer 22 is exposed from the opening 54b.

Figure 9C:
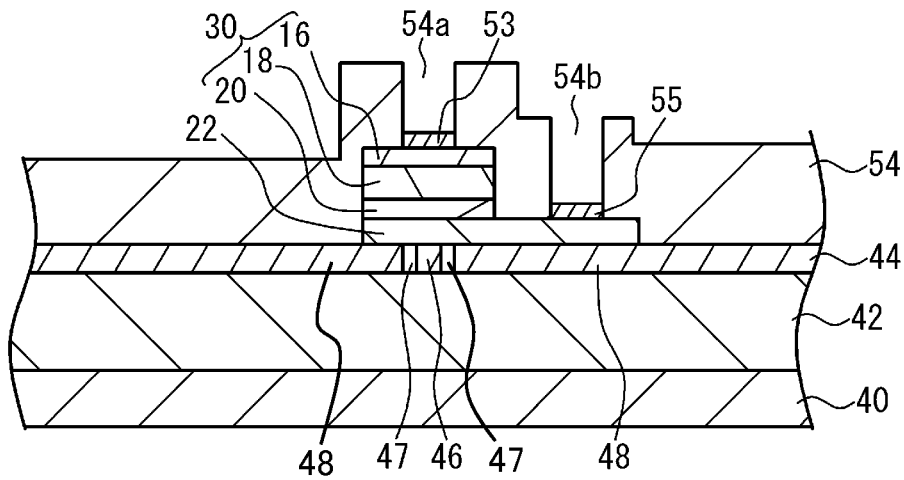

As shown in FIG. 9C, the p-type electrode 53 is formed in the opening 54a, and the n-type electrode 55 is formed in the opening 54b, by vapor deposition, for example. The p-type electrode 53 is in contact with the p-type contact layer 16, and is a stack in which titanium (Ti), platinum (Pt) and gold (Au) are stacked in order from a side close to the p-type contact layer 16. The n-type electrode 55 is in contact with the n-type contact layer 22 and is a stack in which Au, germanium (Ge), nickel (Ni) and Au are stacked in order from a side closer to the n-type contact layer 22.

The p-type wiring 56 and the n-type wiring 58 shown in FIGS. 1A and 1B are formed by vapor deposition, for example. The p-type wiring 56 and the n-type wiring 58 are made of Au having a thickness of 2 μm, for example. The wafer 41 is diced to form a plurality of optical semiconductor elements 100.

According to the first embodiment, the two walls 45 are provided in the groove 47 and arranged in the extending direction of the groove 47. The walls 45 suppress the entering of the etchant from the groove 47, so that the etchant is hard to reach the n-type contact layer 22 of the small piece 32. Since the etching of a lower surface of the small piece 32 is suppressed and a junction interface is protected, the peeling of the small piece 32 is suppressed. Since the etchant is prevented from further entering not only into the n-type contact layer 22 but also into the p-type contact layer 16, the p-type clad layer 18 and the active layer 20, damage and disappearance by etching of these layers are also suppressed.

As shown in FIG. 5A, the small piece 32 overlaps with the two walls 45 when the small piece 32 is jointed to the Si layer 44. For this reason, the portion of the groove 47 in the region R1 is closed by the small piece 32, the walls 45 and the terraces 48, and the entering of the etchant is effectively suppressed. The small piece 32 is less likely to be damaged, the peeling of the small piece 32 is effectively suppressed, and the damage or disappearance by etching of the compound semiconductor layer is also suppressed. Further, as shown in FIG. 8A, the mesa 30 is sandwiched by the walls 45 in the extending direction of the groove 47. In other words, the mesa 30 is formed on the portion (i.e., the region R1) sandwiched by the walls 45. Since the damage to the mesa 30 is suppressed, the characteristic of the optical semiconductor element 100 is stabilized.

In order to form the mesa 30 in the region R1, the small piece 32 may be jointed so as to overlap with the region R1 and the two walls 45, and the portion of the small piece 32 in the region R1 may become the mesa 30. Also, the length L1 of the mesa 30 may be smaller than the distance D1 between the two walls 45. Even if misalignment occurs at the time of the conjunction of the small piece 32, the mesa 30 can be included in the region R1.

As shown in FIG. 4B, the waveguide mesa 46, the terraces 48 and the walls 45 have the same height. Therefore, the lower surface of the small piece 32 is in contact with the upper surfaces thereof, and the portion of the groove 47 is completely closed by the small piece 32, the walls 45, the terrace 48 and the waveguide mesa 46. Therefore, the entering of the etchant is effectively suppressed, and the small piece 32 is hard to be damaged. Accordingly, the peeling of the small piece 32 is effectively suppressed. In the case of using a highly viscous etchant, the terraces 48 and the walls 45 need not have the exact same height. Even if the waveguide mesa 46 and the walls 45 have the same height, and the heights of the terraces 48 are higher than those of the waveguide mesa 46 and the walls 45, there is a case where the entering of the etchant is suppressed by the viscosity of the etchant. When a difference in height between the terraces 48 and the walls 45 is 0.05 µm or less for example, the groove 47 is not completely closed, but the entering of the etchant into the region R1 is suppressed by the viscosity of the etchant.

As shown in FIG. 3B, each of the walls 45 orthogonally intersects the waveguide mesa 46. Thereby, the entering of the etchant can be suppressed.

Each wall 45 is connected to the waveguide mesa 46 and one of the terraces 48. That is, one end of the wall 45 reaches the waveguide mesa 46, and the other end reaches the terrace 48. Thereby, the groove 47 is separated into two regions by the wall 45. Therefore, the entering of the etchant into the region R1 can be effectively suppressed.

The wall 45 scatters the light and causes the light loss. The wall 45 is preferably thin to suppress the scattering. However, the etchant may enter into the region R1 when the wall 45 is thin, and the etchant is hard to enter as the wall 45 becomes thicker. In order to achieve the suppression of the light scattering and the entering of the etchant, the thickness T1 of the wall 45 in the extending direction of the groove 47 is preferably 0.5 µm or more and 2 µm or less. The loss caused by the fluctuation of a mode shape of the light can be suppressed to 0.5 dB or less per wall when the light passes through the wall 35.

In the wet etching of the semiconductor substrate 10, for example, HCl, a mixed solution of HCl and acetic acid, a mixed solution of HCl and hydrogen peroxide water and water or the like is used as the etchant. The semiconductor substrate 10 is made of InP and can be etched by the above etchant. On the contrary, the p-type contact layer 16 made of GaInAs is hard to etch. Other compound semiconductors may be used as the semiconductor substrate 10 and the compound semiconductor layer.

Second Embodiment

Figure 10:
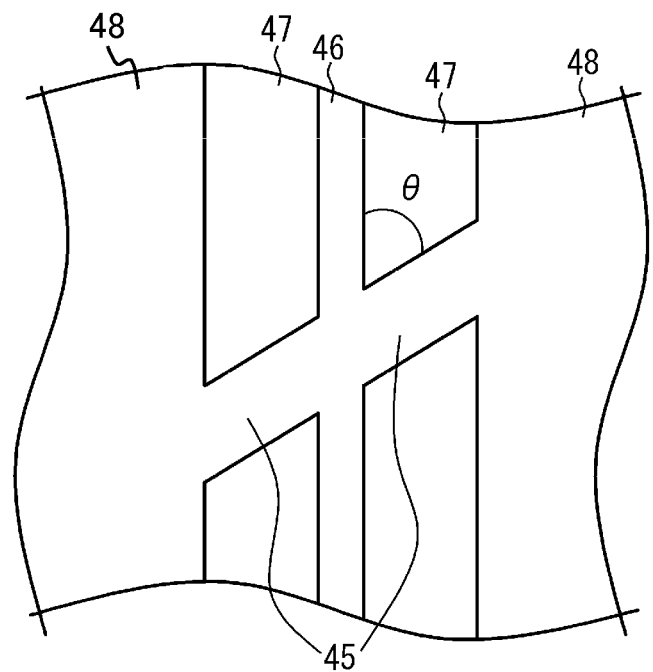
FIG. 10 is an enlarged plane view of the wall according to a second embodiment.

In a second embodiment, an example in which the walls 45 are inclined is described. Elements corresponding to those of the first embodiment are designated by identical reference numerals, and description thereof is omitted. FIG. 10 is an enlarged plane view of the walls 45 according to the second embodiment. As shown in FIG. 10, the walls 45 are inclined with respect to the extending direction of the groove 47 (i.e., the waveguide mesa 46), and an angle θ between the extending direction of the groove 47 and the walls 45 (i.e., an angle θ between the waveguide mesa 46 and the walls 45) is, for example, 30° or more and 60° or less.

According to the second embodiment, the walls 45 prevent the etchant from entering, thereby suppressing the damage to the small piece 32 and suppressing the peeling of the small piece 32, similarly to the first embodiment. In addition, since the walls 45 are inclined, the reflection of the light can be suppressed as compared with a case where the walls 45 orthogonally intersect the waveguide mesa 46. As a result, it is suppressed that the reflected light propagates in the waveguide. The light is repeatedly reflected between the walls 45 to resonate, thereby suppressing the unstable operation of the active element.

The first embodiment and the second embodiment may be combined. For example, the wall 45 orthogonal to the waveguide mesa 46 may be provided on one side of the small piece 32 and the inclined wall 45 may be provided on the other side. In the first and the second embodiments, the groove 47 is provided with at least two walls 45 per small piece 32. That is, the region R1 of the groove 47 separated by the walls 45 corresponds to the single small piece 32. In a third and a fourth embodiments, more walls 45 are provided.

Third Embodiment

Figure 11:
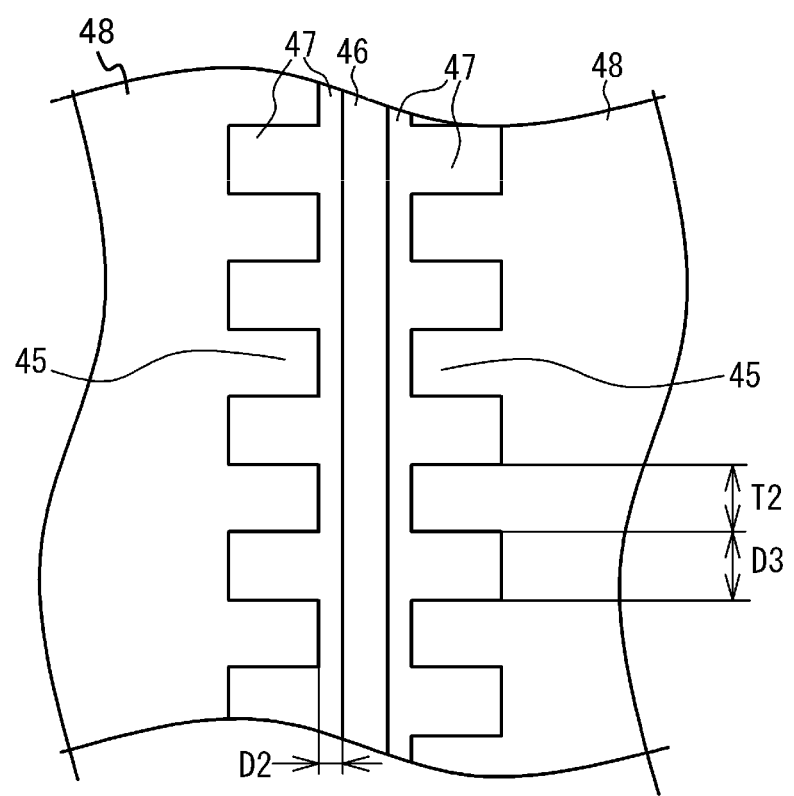
FIG. 11 is an enlarged plane view of the wall according to a third embodiment.

In the third embodiment, the plurality of walls 45 are provided, and there is a gap between each wall 45 and the waveguide mesa 46. Elements corresponding to those of the first embodiment are designated by identical reference numerals, and description thereof is omitted. FIG. 11 is an enlarged plane view of the walls 45 according to the third embodiment. As shown in FIG. 11, one end of each wall 45 is connected to the terrace 48 and the other end is not connected to the waveguide mesa 46. There is the gap between the wall 45 and the waveguide mesa 46, and a distance D2 therebetween (i.e., the distance D2 of the gap) is, for example, 0.5 µm.

The plurality of walls 45 are provided along the extending direction of the groove 47. For example, ten or more walls 45 are disposed on one side of the mesa 30 for each groove 47. A distance D3 between adjacent walls 45 is, for example, 1 µm, and a thickness T2 of the wall 45 is, for example, 1 µm.

According to the third embodiment, since the distance D2 between the wall 45 and the waveguide mesa 46 is about 0.5 µm, it takes time for the etchant to pass through the walls 45 due to the surface tension of the etchant. The plurality of walls 45 are provided in the groove 47, so that the time required for the etchant to pass through all the walls 45 is further lengthened. For this reason, the etching of the semiconductor substrate 10 is completed before the etchant etches the compound semiconductor layer in the region of the small piece 32 where the active element is formed. Therefore, the damage to the small pieces 32 is suppressed, the peeling of the small pieces 32 is suppressed, and the damage or disappearance by etching of the compound semiconductor layer in the region where the active element is formed is suppressed.

The entering of the etchant can be suppressed as the number of walls 45 increases, but the light loss due to the scattering increases. Therefore, 10 or more and 100 or less walls 45 may be provided on one side of the small piece 32 in the single groove 47, for example. That is, one end of the mesa 30 is opposed to ten or more sets of walls 45.

Since the walls 45 are not connected to the waveguide mesa 46, the scattering of the light by the walls 45 can be suppressed and the light loss can be reduced. The distance D2 can be set to 0.2 µm or more and 1 µm or less in order to suppress the scattering of the light and the entering of the etchant.

Fourth Embodiment

Figure 12:
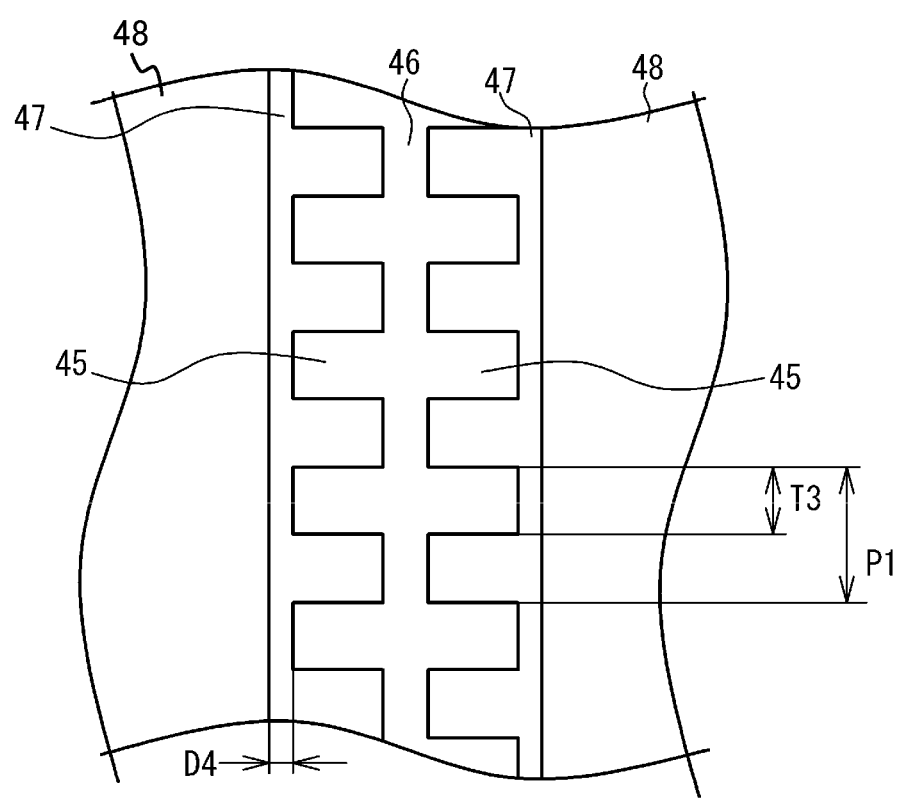
FIG. 12 is an enlarged plane view of the wall according to a fourth embodiment.

In the fourth embodiment, the plurality of walls 45 are provided, and there is a gap between each wall 45 and the terrace 48. Elements corresponding to those of the first to third embodiments are designated by identical reference numerals, and description thereof is omitted. FIG. 12 is an enlarged plane view of the walls 45 according to the fourth embodiment. As shown in FIG. 12, one end of each wall 45 is connected to the waveguide mesa 46 and the other end is not connected to the terrace 48. There is the gap between the wall 45 and the terrace 48, and a distance D4 therebetween (i.e., the distance D4 of the gap) is, for example, 0.5 µm.

The plurality of walls 45 are provided along the extending direction of the groove 47. For example, several tens or hundreds of walls 45 are disposed on one side of the mesa 30 for each groove 47. A pitch P1 between the adjacent walls 45 is, for example, 0.3 µm, and a thickness T3 of the wall 45 is, for example, 0.15 µm.

According to the fourth embodiment, the time required for the etchant to pass through all the walls 45 is lengthened, similarly to the third embodiment. For this reason, the etching of the semiconductor substrate 10 is completed before the etchant etches the compound semiconductor layer of the small piece 32. Therefore, the damage to the small pieces 32 is suppressed, the peeling of the small pieces 32 is suppressed, and the disappearance by etching of the compound semiconductor layer in the region where the active element is formed is suppressed.

The walls 45 are connected to the waveguide mesa 46 and not connected to the terrace 48. The walls 45 function as a diffraction grating. That is, distributed bragg reflector (DBR) structure is formed on the wafer 41, and diffraction gratings are disposed on both sides of the mesa 30. The pitch P1 is determined in accordance with a wavelength of the light. When the wavelength is 1.55 µm for example, the pitch P1 is 0.3 µm.

The number of walls 45 on one side of the mesa 30 may be determined by a reflectivity of the desired DBR structure, and may be different from the number on the other side. For example, a hundred sets of walls 45 are provided on one side of the mesa 30 to obtain the reflectivity of 99% or more, and several tens of walls 45 are provided on the other side to obtain the reflectivity of several tens of percent. In order to suppress the scattering of the light, the light is emitted from a side having less walls 45 to the outside.

What is claimed is:

1. A method of manufacturing an optical semiconductor element comprising:
    stacking a plurality of compound semiconductor layers on a first substrate containing a compound semiconductor;
    dividing the first substrate into small pieces;
    forming terraces, grooves, walls, and a first mesa for a waveguide on a second substrate containing silicon;
    jointing at least one small piece to the second substrate after the forming;
    wet-etching the first substrate so as to expose the compound semiconductor layers after the jointing; and
    forming a second mesa opposite to the first mesa from the compound semiconductor layers;
    wherein the grooves are formed on both sides of the first mesa,
    the terraces are formed on both sides of the first mesa and the grooves, and
    the walls are arranged in an extending direction of each groove.

2. The method of manufacturing the optical semiconductor element according to claim 1, wherein
    the at least one small piece is jointed to the second substrate so as to overlap with the first mesa, the terraces, the grooves and the walls, and
    the second mesa is located between the walls in the extending direction of the grooves without overlapping with the walls.

3. The method of manufacturing the optical semiconductor element according to claim 1, wherein
    the first mesa and the walls have the same height.

4. The method of manufacturing the optical semiconductor element according to claim 1, wherein
    each of the walls orthogonally intersects the first mesa.

5. The method of manufacturing the optical semiconductor element according to claim 1, wherein
    an angle between each of the walls and the extending direction of the grooves is 30 degrees or more and 60 degrees or less.

6. The method of manufacturing the optical semiconductor element according to claim 1, wherein
    each of the walls is connected to the first mesa and one of the terraces.

7. The method of manufacturing the optical semiconductor element according to claim 1, wherein
    each of the walls is connected to one of the first mesa and the terraces without being connected to the other thereof,
    the walls are formed along the extending direction of the grooves, and
    the walls are located on each of both sides of the second mesa in the extending direction of the grooves.

8. The method of manufacturing the optical semiconductor element according to claim 7, wherein
    each of the walls is connected to the first mesa without being connected to the terraces.

9. The method of manufacturing the optical semiconductor element according to claim 1, wherein
    a thickness of each of the walls in the extending direction of the grooves is 0.1 µm or more and 2 µm or less.

* * * * *